(12) United States Patent
Lee

(10) Patent No.: US 7,875,924 B2
(45) Date of Patent: Jan. 25, 2011

(54) FLASH MEMORY DEVICE AND METHOD FOR FABRICATING THE SAME

(75) Inventor: Yong-Jun Lee, Seongdong-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 336 days.

(21) Appl. No.: 12/203,951

(22) Filed: Sep. 4, 2008

(65) Prior Publication Data

US 2009/0065847 A1 Mar. 12, 2009

(30) Foreign Application Priority Data

Sep. 12, 2007 (KR) .................. 10-2007-0092749

(51) Int. Cl.
*H01L 29/00* (2006.01)
(52) U.S. Cl. .............. 257/321; 257/E29.001; 438/594
(58) Field of Classification Search ........... 257/321, 257/E29.001; 438/594
See application file for complete search history.

(56) References Cited

U.S. PATENT DOCUMENTS

| 6,303,708 | B1 | 10/2001 | Brown |
| 7,485,533 | B2 * | 2/2009 | Lee ............... 438/261 |
| 2003/0160280 | A1 * | 8/2003 | Yoshino ............ 257/324 |
| 2005/0236662 | A1 | 10/2005 | Lee |
| 2007/0231986 | A1 * | 10/2007 | Shin .............. 438/197 |
| 2009/0101961 | A1 * | 4/2009 | He et al. ............ 257/319 |
| 2010/0221881 | A1 * | 9/2010 | Ozawa ............. 438/264 |

* cited by examiner

*Primary Examiner*—Trung Dang
(74) *Attorney, Agent, or Firm*—Sherr & Vaughn, PLLC

(57) ABSTRACT

An embedded flash memory device and a method for fabricating the same which reduces the size of a memory device using logic CMOS fabricating processes and enhancing a coupling ratio of the memory device. The flash memory device includes a coupling oxide layer on an active area of a semiconductor substrate, a first control gate formed on and/or over the coupling oxide layer and a second control gate formed on and/or over and enclosing lateral sidewalls of the coupling oxide layer and the first control gate.

20 Claims, 6 Drawing Sheets

FLASH MEMORY DEVICE AND METHOD FOR FABRICATING THE SAME

The present application claims priority under 35 U.S.C. §119 to Korean Patent Application No. 10-2007-0092749 (filed on Sep. 12, 2007), which is hereby incorporated by reference in its entirety.

BACKGROUND

Nonvolatile memory devices such as flash memory devices, are capable of preserving data stored in a memory cell even when power is not supplied. Flash memory devices are also capable of high-speed electric erasing of the data in a state of being mounted to a circuit board. An electrically erasable programmable read-only memory (EEPROM) is a nonvolatile memory device which is electrically rewritable. An EEPROM may have a general structure that includes a floating gate cell. In accordance with increased demand to manufacture highly integrated semiconductor devices, it is very desirable to reduce the size of the floating gate cell. However, because high voltage is required when performing programming and erasing and a predetermined space is required to define a tunnel, it is very difficult to accomplish further reduction of the floating gate type cell. Consequently, research has been actively conducted into non-volatile memory devices such as polysilicon-oxide-nitride-oxide-semiconductor (SONOS), ferro-electric random-access memory (FeRAM), single-electron transistor (SET), nonvolatile read-only memory (NROM) etc., as substitutes for the floating gate cell. Among them, the SONOS cell is attracting public attention as a next generation cell that can substitute for the floating gate cell.

Figure 1A:
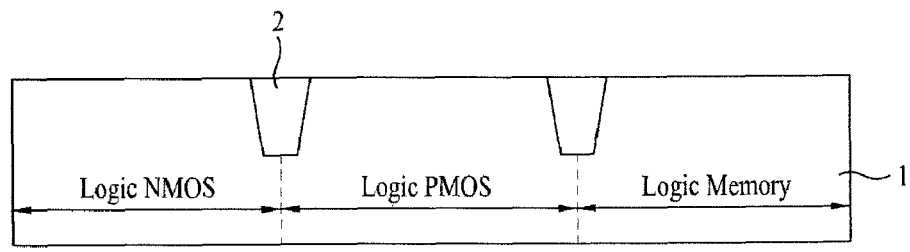

As illustrated in example FIG. 1A, a fabrication process of an embedded memory device may include forming field oxide layer 2 in semiconductor substrate 1 through a shallow trench isolation (STI) process, thereby defining a field area and an active area. Semiconductor substrate 1 in the active area is separated by field oxide layer 2 into a logic P-type metal oxide semiconductor (PMOS) area, a logic N-type metal oxide semiconductor (NMOS) area, and a logic memory area.

Figure 1B:
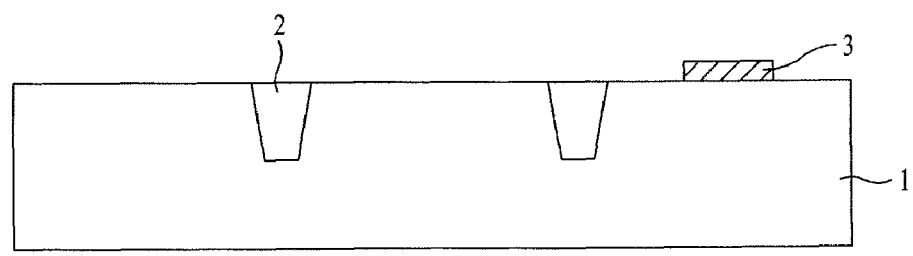

As illustrated in example FIG. 1B, a tunneling oxide layer, a trap nitride layer, and a block oxide layer are deposited sequentially on and/or over semiconductor substrate 1, thereby forming coupling oxide layer 3. Coupling oxide layer 3 may generally refer to all layers fabricated in a manner that the tunneling oxide layer, the trap nitride layer and the block oxide layer are sequentially deposited and patterned. An annealing process is performed at about 800 to 950° C. to enhance the quality of coupling oxide layer 3. Coupling oxide layer 3 may be formed by patterning the block oxide layer so that the block oxide layer remains at only a portion of the memory area to form coupling oxide layer 3. A wet etching process which uses a $H_3PO_4$ solution as a mask is then performed on the patterned block oxide layer, thereby removing the trap nitride layer. A flash high voltage (FHV) oxide layer for forming an FHV transistor of a charge pumping circuit may then be formed in order to apply high voltage to the memory device formed on the tunneling oxide layer exposed by removal of the trap nitride layer. Additionally, ion implantation for forming a well is performed so that a P-well is formed in the logic NMOS area. An N-well may be formed in the logic PMOS area and the memory area. The memory device is the PMOS memory, and the N-well is formed. When forming the PMOS memory, the N-well may be formed in the memory area. Then, the FHV oxide layer remaining on and/or over the area except the charge pumping circuit area is removed. The FHV oxide layer formed on and/or over the NMOS area, the PMOS area and the memory area is all removed. After etching the tunneling oxide layer by using the block oxide layer as a mask, a gate oxide layer may then be formed on and/or over semiconductor substrate 1 exposed by the removal of the tunneling oxide layer.

Figure 1C:
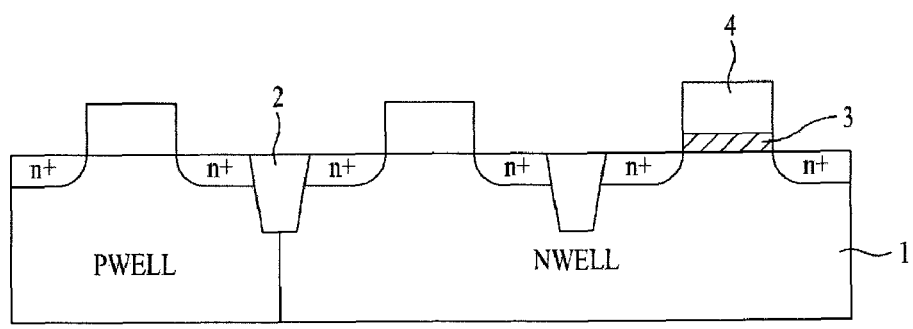

As illustrated in example FIG. 1C, a polysilicon layer is applied to the whole surface of semiconductor substrate 1 and then selectively removed, such that a PMOS gate is formed on and/or over the PMOS area and an NMOS gate is formed on and/or over the NMOS area. Control gate 4 is formed on and/or over coupling oxide layer 3 in the logic memory area.

Figure 1D:
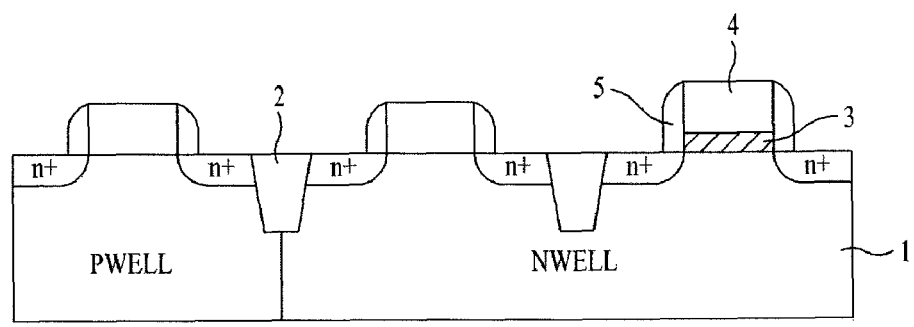

As illustrated in example FIG. 1D, a lightly doped drain (LDD) area is formed by implanting low-concentration dopant ions using the respective gates as masks. Insulating sidewall 5 is formed at both sides of the respective gates. Using the respective gates and sidewalls 5 of the insulating layer as masks, high-concentration dopant ions are implanted, thereby forming a high-concentration dopant area. Through the fabrication processes for a logic CMOS device as described above, the logic embedded memory device is completed.

However, in the above-described logic embedded memory device, each device has a large size, and density among the respective memory devices is great. Therefore, the logic embedded memory device is restricted in use as a large-capacity memory. When the size of the memory device is reduced so as to decrease the density among the memory devices, due to the above problem, a coupling ratio of the respective memory devices is reduced. As a result, the property of the memory device is deteriorated.

SUMMARY

Embodiments relate to an embedded flash memory device and a method for fabricating the same that reduces the size of a memory device using logic CMOS fabricating processes and which also enhances a coupling ratio of the memory device.

Embodiments relate to a flash memory device that may include at least one of the following: a coupling oxide layer formed by sequentially depositing a tunneling oxide layer, a trap nitride layer, and a block oxide layer on and/or over an active area of a semiconductor substrate; a first control gate formed on and/or over the coupling oxide layer; and a second control gate formed to enclose lateral sides of the coupling oxide layer and the first control gate.

In accordance with embodiments, the first control gate may have a stepped portion at lateral sides thereof. The flash memory device may further include a thermal oxide layer formed on and/or over surfaces of the coupling oxide layer and the first control gate. The coupling oxide layer may be formed on and/or over an upper surface of the semiconductor substrate corresponding to a lower surface of the first control gate, thereby operating as a tunneling oxide layer. The coupling oxide layer may be formed on and/or over an upper surface of the semiconductor substrate corresponding to the second control gate such that a part of the coupling oxide layer in contact with a lower surface of the second control gate operates as a tunneling oxide layer.

Embodiments relate to a method for fabricating the flash memory device that may include at least one of the following steps: forming a coupling oxide layer by sequentially depositing a tunneling oxide layer, a trap nitride layer and a block oxide layer on and/or over an active area of a semiconductor substrate; and then forming a first control gate on and/or over the coupling oxide layer; and then forming a second control gate to enclose lateral sides of the coupling oxide layer and the first control gate.

In accordance with embodiments, the first control gate forming step may include sequentially forming a first polysilicon layer and a first nitride on and/or over the semiconductor substrate including the coupling oxide layer; and then patterning the first nitride through lithography and development processes, thereby forming a first nitride layer having a smaller width than the coupling oxide layer; and then selectively removing the first polysilicon layer by a predetermined thickness using the first nitride layer as a mask, thereby forming the first control gate having a stepped portion at lateral sides thereof. The fabricating method may further include forming a nitride spacer on lateral sides of the first nitride layer and lateral sides of the first polysilicon layer which is removed with the first nitride layer used as the mask, by applying a second nitride on and/or over the whole surface of the semiconductor substrate and performing etching with respect to the second nitride. The fabricating method may further include performing etching by using the first nitride layer and the nitride spacer as masks; and then removing the first nitride layer and the nitride spacer. The fabricating method may further include performing a thermal oxidation process with respect to the whole surface of the semiconductor substrate including the coupling oxide layer and the first control gate. The second control gate forming step may include forming a second polysilicon layer on and/or over the whole surface of the semiconductor substrate including the first control gate; and then selectively removing the second polysilicon layer by blanket etching, thereby forming the second control gate in the form of a sidewall enclosing lateral sides of the coupling oxide layer and the first control gate. The fabricating method may further include forming a sidewall spacer at both sides of the second control gate.

Embodiments relate to a method that may include at least one of the following steps: forming an oxide layer pattern in an active area of a semiconductor substrate; and then sequentially forming a first polysilicon layer and a first nitride layer over the semiconductor including oxide layer pattern; and then forming a first nitride layer pattern over the oxide layer pattern and a second nitride layer pattern spaced part from the first nitride layer pattern by patterning the first nitride layer; and then forming stepped portions on portions of the first polysilicon layer formed over the oxide layer pattern by selectively removing the first polysilicon layer using the first and second nitride layer patterns as masks; and then forming a first control gate interposed between the first nitride layer pattern and the oxide layer pattern after forming the nitride spacer; and then forming a gate oxide layer over the control gate and on sidewalls of the control gate; and then forming a second control gate at sidewall of the first control gate; and then forming a sidewall spacer on sidewalls of the second control gate.

DRAWINGS

Example FIGS. 1A to FIG. 1D illustrate a fabrication process of an embedded memory device.

Example FIGS. 2 to FIG. 3 illustrate a fabrication process of a flash memory device in accordance with embodiments.

DESCRIPTION

Reference will now be made in detail to embodiments, examples of which are illustrated in the accompanying drawings. Wherever possible, the same reference numbers will be used throughout the drawings to refer to the same or like parts.

Figure 2A:
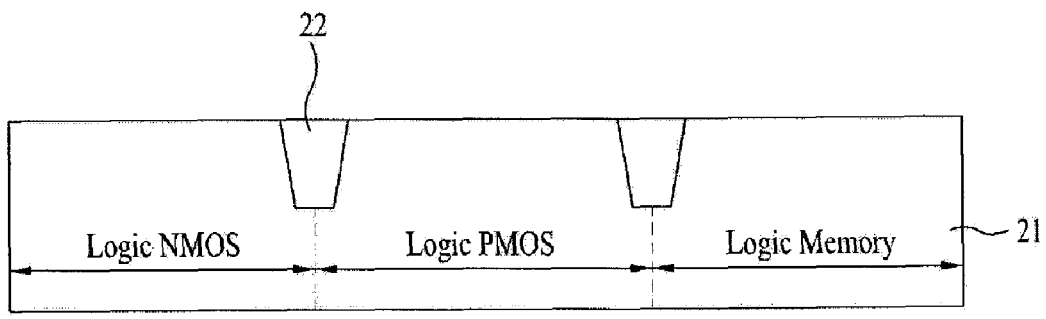

As illustrated in example FIG. 2A, field oxide layer 22 is formed in semiconductor substrate 21 through an STI process, thereby defining a field area and an active area. Semiconductor substrate 21 in the active area is separated by field oxide layer 22 into a logic PMOS area, a logic NMOS area, and a logic memory area.

Figure 2B:
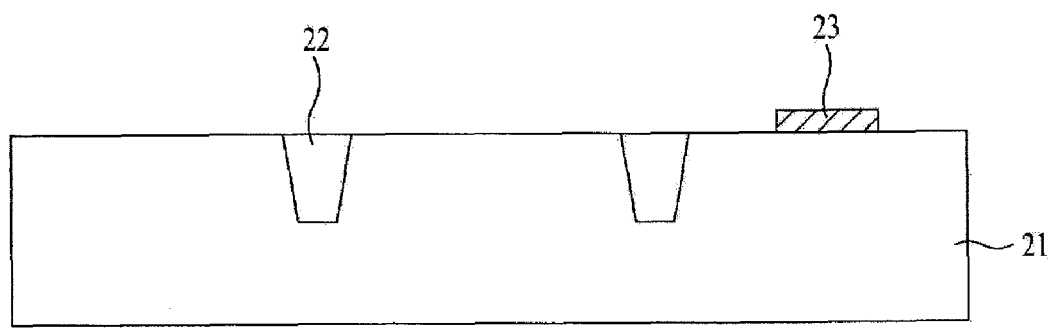

As illustrated in example FIG. 2B, coupling oxide layer 23 is formed by sequentially depositing a tunneling oxide layer, a trap nitride layer and a block oxide layer on and/or over semiconductor substrate 21. Coupling oxide layer 23 may refer to all layers fabricated in a manner that the tunneling oxide layer, the trap nitride layer and the block oxide layer are sequentially deposited and patterned. An annealing process may then be performed at about 800 to 950° C. to enhance the quality of coupling oxide layer 23. Coupling oxide layer 23 may be formed as follows. First, the block oxide layer is patterned to remain at only a portion of the logic memory area so as to form coupling oxide layer 23. Wet etching is then performed on the patterned block oxide layer using a $H_3PO_4$ solution as a mask, thereby removing the trap nitride layer. Next, an FHV oxide layer may be further formed in order to apply high voltage to the memory device formed on and/or over the tunneling oxide layer exposed by removal of the trap nitride layer. Here, the FHV oxide layer refers to an oxide layer for forming an FHV transistor of a charge pumping circuit. Coupling oxide layer 23 may be patterned to remain only on and/or over a first control gate area that will be formed later, or up to a gate sidewall area including first and second control gate areas. Additionally, an ion implantation process for formation of a well is performed so that a P-well is formed in the logic NMOS area. An N-well may be formed in the logic PMOS area and the memory area. The logic memory device is the PMOS memory, and the N-well is then formed therein. When forming the PMOS memory, the N-well may be formed in the memory area. Then, the FHV oxide layer is removed from the area except the charge pumping circuit area. The FHV oxide layer formed on and/or over the NMOS area, the PMOS area and the memory area are all removed. Next, after etching the tunneling oxide layer by using the block oxide layer as a mask, a gate oxide layer may be formed on and/or over semiconductor substrate 21 which is exposed by the removal of the tunneling oxide layer.

Figure 2C:
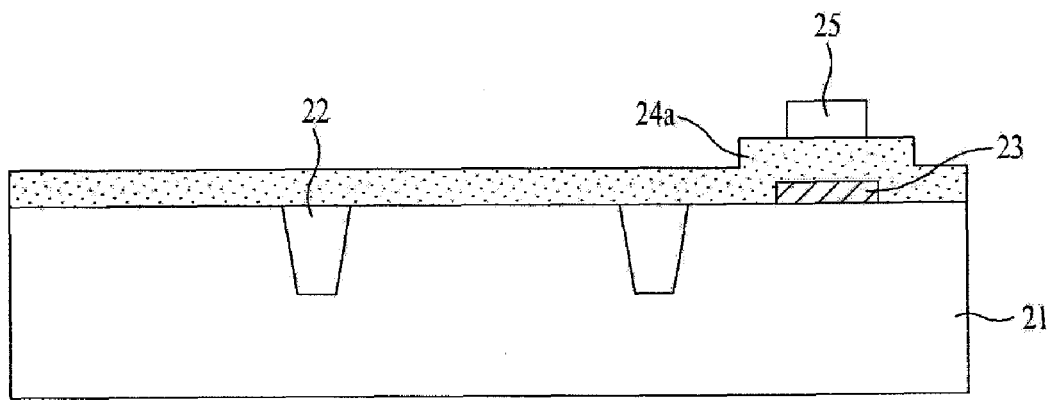

As illustrated in example FIG. 2C, polysilicon layer 24a and a photoresist are then formed on and/or over the whole surface of semiconductor substrate 21 including coupling oxide layer 23. Photoresist pattern 25 is then formed by performing lithography and development processes. Photoresist pattern 25 is formed to have a smaller width than coupling oxide layer 23 disposed at the lower portion thereof.

Figure 2D:
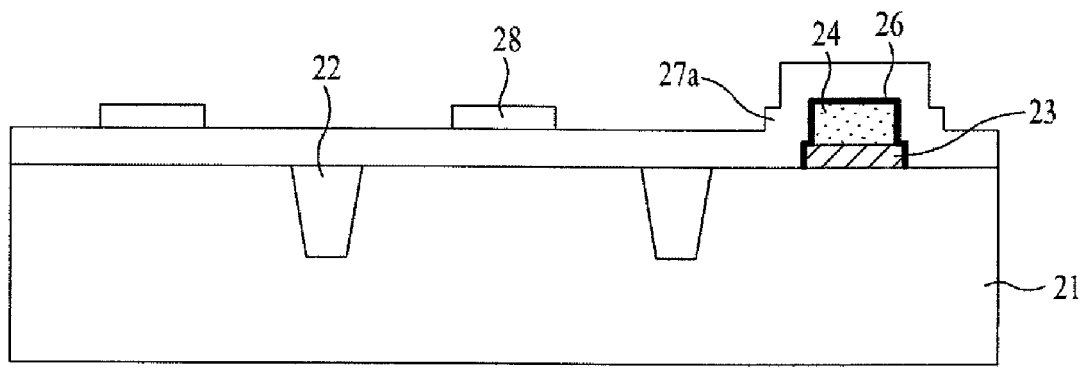

As illustrated in example FIG. 2D, polysilicon layer 24a is selectively removed by etching using photoresist pattern 25, thereby forming control gate 24 on and/or over coupling oxide layer 23 of the memory area. Since photoresist pattern 25 is formed having a smaller width than coupling oxide layer 23 disposed at the lower portion thereof, coupling oxide layer 23 and control gate 24 combine to form a stepped surface. A thermal oxidation process is then performed with respect to the surface of semiconductor substrate 21 to thereby simultaneously form gate oxide layer 26 on and/or over surfaces of coupling oxide layer 23 and control gate 24. Polysilicon layer 27a and a photoresist layer are then sequentially formed on and/or over the whole surface of semiconductor substrate 21 including gate oxide layer 26. Photoresist pattern 28 is then formed through lithography and development processes to eventually form a PMOS gate and a NMOS gate at the PMOS area and the NMOS area, respectively.

Figure 2E:
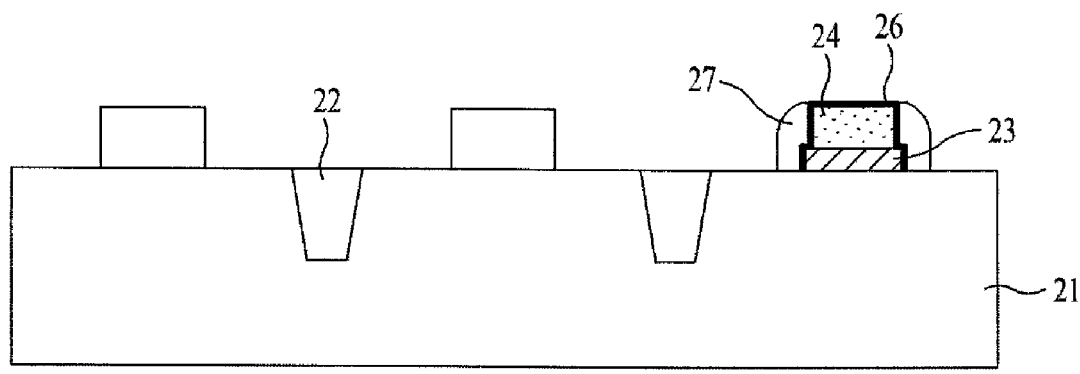

As illustrated in example FIG. 2E, an anisotropic etching process, for example, a blanket etching process is performed to selectively remove polysilicon layer 27a, thereby forming the PMOS gate at the PMOS area and the NMOS gate at the NMOS area. Gate sidewall 27 is formed on and/or over sidewalls of coupling oxide layer 23, control gate 24 and gate oxide layer 26. Gate sidewall 27 may be formed to directly contact sidewalls of gate oxide layer 26. Through contact with a lowermost surface of control gate 24, coupling oxide layer 23 formed at an upper surface of semiconductor substrate 21 can be used as a first tunneling oxide layer. In case that coupling oxide layer 23 is formed in contact with up to a lower surface of gate sidewall 27 including control gate 24, coupling oxide layer 23 at the area contacting with the lower surface of gate sidewall 27 can serve as a second tunneling oxide layer.

Figure 2F:
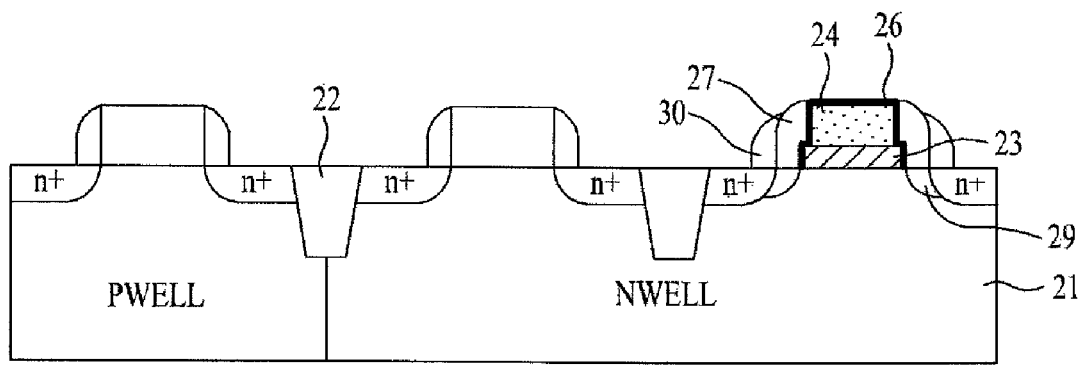

As illustrated in example FIG. 2F, source/drain dopant area 29, for example, a lightly doped drain (LDD) area is formed by implanting low-concentration dopant ions in semiconductor substrate 21 using coupling oxide layer 23 and control gate 24 as masks. In addition, sidewall spacer 30 is formed at sidewalls of gate sidewalls 27. An insulating sidewall such as sidewall spacer 30 may be formed by vapor-depositing a tetra ethyl ortho silicate (TEOS) oxide layer and a nitride layer and performing anisotropic etching with the deposited layers. Control gates 24 and sidewall spacers 30 are used as masks in a process of implanting high-concentration dopant ions to thereby form high-concentration dopant area n+, thereby completing a logic embedded memory device.

Figure 3A:
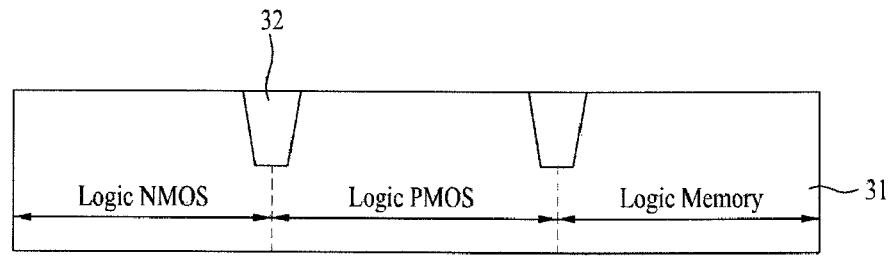

As illustrated in example FIG. 3A, a process of fabricating a flash memory device in accordance with embodiments includes forming field oxide layer 32 in semiconductor layer 31 by performing an STI process, thereby defining a field area and an active area. Semiconductor substrate 31 in the active area is separated by field oxide layer 32 into a logic PMOS area, a logic NMOS area, and a logic memory area.

Figure 3B:
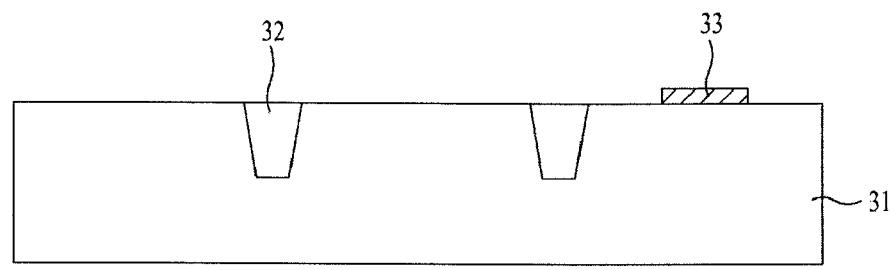

As illustrated in example FIG. 3B, coupling oxide layer pattern 33 is then formed by depositing a tunneling oxide layer, a trap nitride layer and a block oxide layer on and/or over semiconductor substrate 31. The tunneling oxide layer is formed to a thickness of between 10 to 30Å, the trap nitride layer formed to a thickness of between 80 to 120 Å, and the block oxide layer formed to a thickness of between 30 to 60 Å. Coupling oxide layer 33 may generally refer to all layers fabricated in a manner that the tunneling oxide layer, the trap nitride layer and the block oxide layer are sequentially deposited and patterned. Next, an annealing process may be performed at about 800 to 950° C. to enhance the quality of coupling oxide layer pattern 33. Coupling oxide layer 33 is formed as follows. First, the tunneling oxide layer, the trap nitride layer and the block oxide layer are sequentially deposited. The block oxide layer is patterned so as to remain at only a portion of the memory area. Wet etching is performed on the patterned block oxide layer, using a $H_3PO_4$ solution as a mask, thereby removing the trap nitride layer. Next, an FHV oxide layer may be further formed in order to apply high voltage to the memory device formed on and/or over the tunneling oxide layer exposed by removal of the trap nitride layer. Here, the FHV oxide layer refers to an oxide layer for forming an FHV transistor of a charge pumping circuit. Next, ion implantation for formation of a well is performed so that a P-well is formed in the logic NMOS area. An N-well may be formed in the logic PMOS area and the memory area. The memory device is the PMOS memory, and the N-well is formed. When forming the PMOS memory, the N-well may be formed in the memory area. Then, the FHV oxide layer is removed from the area except the charge pumping circuit area. The FHV oxide layer formed on and/or over the NMOS area, the PMOS area and the memory area is all removed. Next, after etching the tunneling oxide layer by using the block oxide layer as a mask, a gate oxide layer may be formed on and/or over semiconductor substrate 31 which is exposed by the removal of the tunneling oxide layer.

Figure 3C:
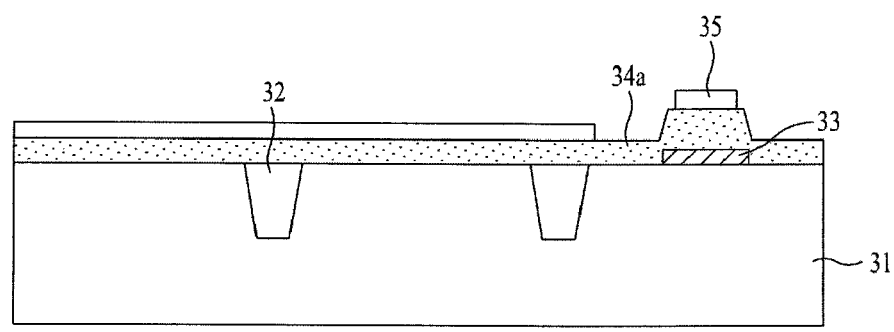

As illustrated in example FIG. 3C, first polysilicon layer 34a and a first nitride layer are sequentially formed on and/or over the whole surface of semiconductor substrate 31 including coupling oxide layer pattern 33. First nitride layer pattern 35 is formed by performing lithography and development processes. First nitride layer pattern 35 is formed having a smaller width than coupling oxide layer pattern 33 disposed at the lower part thereof.

Figure 3D:
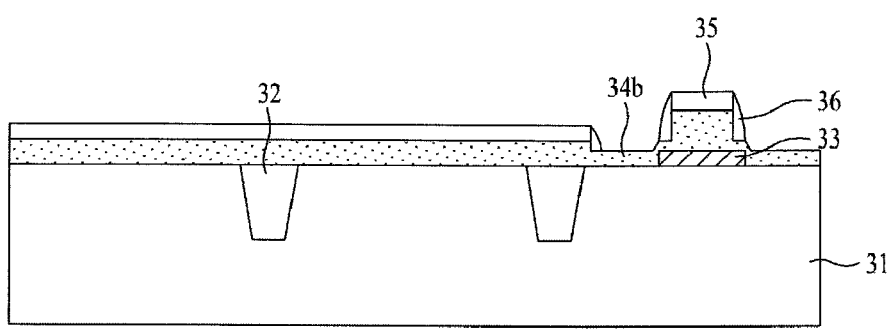

As illustrated in example FIG. 3D, an anisotropic etching process is formed using first nitride layer pattern 35 as a mask, thereby selectively removing first polysilicon layer 34a by a predetermined thickness. More specifically, a portion of first polysilicon layer 34a is removed as deep as half the thickness thereof or more using first nitride layer pattern 35 as a mask. If first polysilicon layer 34a is etched by a half thickness thereof, the thickness of a portion of first polysilicon layer pattern 34b at the area without first nitride layer pattern 35 is half an initial thickness. When etching first polysilicon layer 34a, a portion thereof is removed so that coupling oxide layer pattern 33 disposed at a lower portion of first polysilicon layer 34a is not exposed. First nitride layer pattern 35 is formed to have a smaller thickness than coupling oxide layer 33. By performing etching using first nitride layer pattern 35 as a mask, first polysilicon layer 34b immediately adjacent to coupling oxide layer pattern 33 has a stepped structure. A second nitride is then applied to the whole surface of semiconductor substrate 31 including first nitride layer pattern 35 and first polysilicon layer 34b. An anisotropic etching process, for example, a blanket etching process is then performed to form nitride layer spacer 36 at sidewalls lateral sidewalls of first nitride layer pattern 35 and also at the stepped portion of first polysilicon layer 34b. Nitride layer spacer 36 is provided to fill the stepped portion of first polysilicon layer 34b.

Figure 3E:
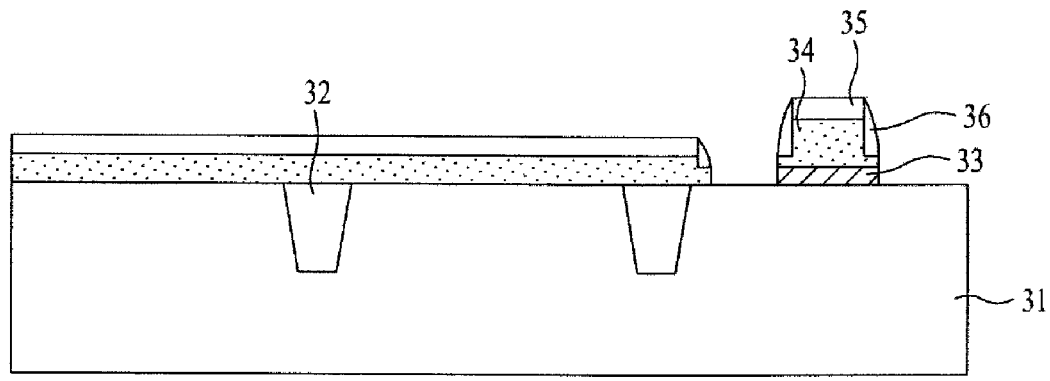

As illustrated in example FIG. 3E, etching is performed using first nitride layer pattern 35 and nitride layer spacer 36 as masks, thereby forming first control gate 34 in the memory area interposed between first nitride layer pattern 35 and coupling oxide layer pattern 33. First nitride layer pattern 35 and nitride layer spacer 36 are disposed at an uppermost surface and sidewalls of first control gate 34, respectively. The stepped portion of first polysilicon layer 34b may be maintained at a sidewall of first control gate 34.

Figure 3F:
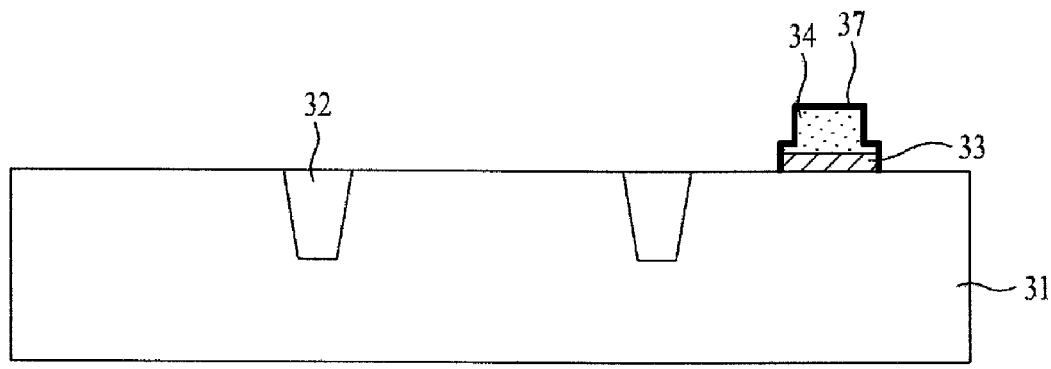

As illustrated in example FIG. 3F, first nitride layer 35 and nitride layer spacers 36 are all removed by etching. A second etching is then performed with respect to the remaining area except the memory area so as not to affect the memory area which includes coupling oxide layer 33 and first control gate 34. Thus, first polysilicon layer 34b remaining at the rest area is all removed to expose semiconductor substrate 31 and field oxide layer 32. In essence, first control gate 34 is formed by performing a first etching using first nitride layer 35 as a mask and a second time using nitride layer spacer 36 as a mask. As first nitride layer 35 and nitride layer spacer 36 are all removed, first control gate 34 is formed to have a stepped portion on lateral sides thereof. Next, a thermal oxidation process is performed with respect to the surface of semiconductor substrate 31 except field oxide layer 32, coupling oxide layer 33, and a surface of the first control gate 34.

Accordingly, gate oxide layer 37 can be formed simultaneously on and/or over surfaces of coupling oxide layer 33 and first control gate 34.

Figure 3G:
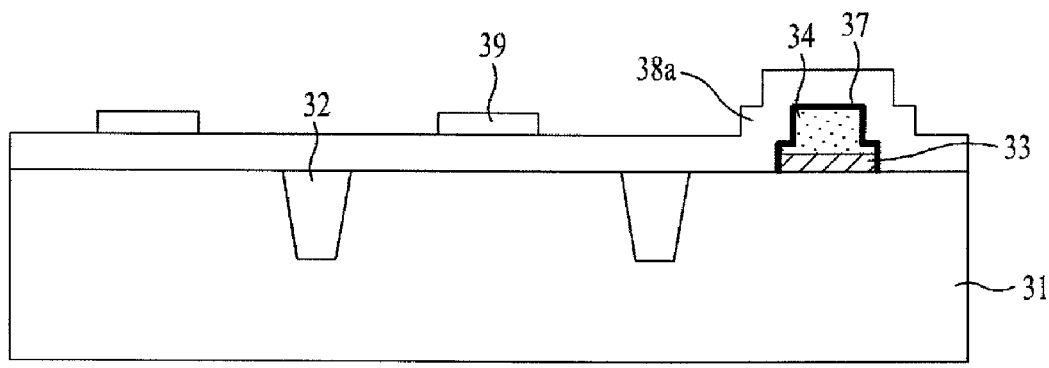

As illustrated in example FIG. 3G, second polysilicon layer 38a and a photoresist are then sequentially formed on and/or over the entire semiconductor substrate 31 including gate oxide layer 37. The photoresist is then patterned through lithography and development processes, thereby forming photoresist pattern 39 to subsequently form the PMOS gate and the NMOS gate respectively at the PMOS area and the NMOS area.

Figure 3H:
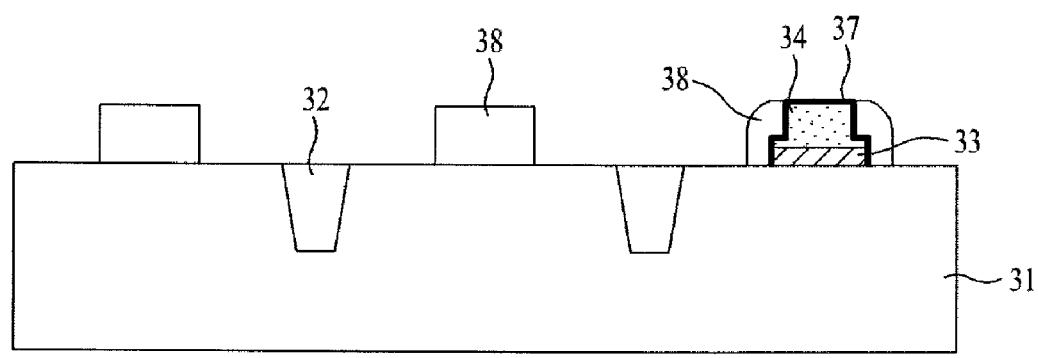

As illustrated in example FIG. 3H, an anisotropic etching process, for example, a blanket etching process is then performed to selectively remove second polysilicon layer 38a, thereby forming the PMOS gate at the PMOS area and the NMOS gate at the NMOS area. Gate sidewall 38 is formed having an expanded contacting area with sidewalls of first control gate 34. Meaning, a second control gate is formed around coupling oxide layer 33 and first control gate 34 where gate oxide layer 37 is formed. For example, the second control gate is formed to enclose lateral sides of coupling oxide layer 33 and first control gate 34.

Figure 3I:
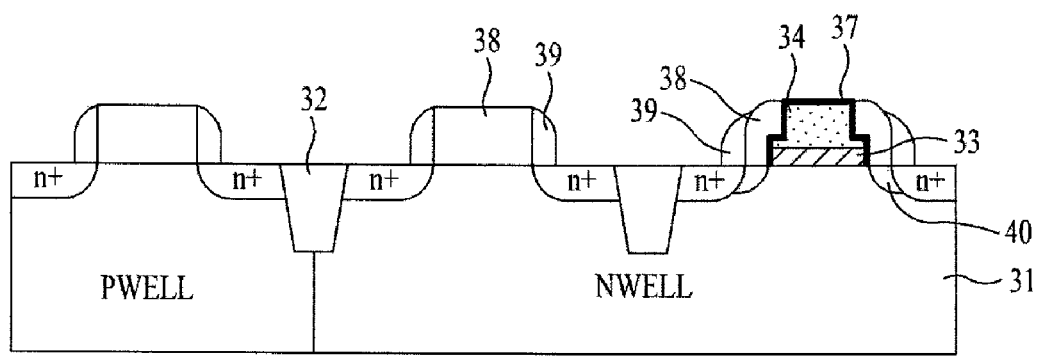

As illustrated in example FIG. 3I, source/drain dopant area 40, for example, an LDD area is then formed by implanting low-concentration dopant ions in semiconductor substrate 31 using gate sidewall 38 and first control gate 34 as masks. In addition, sidewall spacer 39 is formed at both sidewalls of gate sidewall 38. Sidewall spacer 39 may be formed by vapor-depositing a tetra ethyl ortho silicate (TEOS) oxide layer and a nitride layer and performing anisotropic etching with the deposited layers. Furthermore, using gates 34 and sidewall spacers 39 as masks, high-concentration dopant ions are implanted to form high-concentration dopant area n+. By thus performing a fabrication process of a logic CMOS device as described above, fabrication of a logic embedded memory device is completed. Coupling oxide layer pattern 33 formed on and/or over an uppermost surface of semiconductor substrate 31 corresponding to the lower surface of first control gate 34 may serve as a first tunneling oxide layer. In case that coupling oxide layer 33 is formed up to a lower surface of second control gate 38 including first control gate 34, coupling oxide layer 33 at the area contacting the lower surface of second control gate 38 can serve as a second tunneling oxide layer.

As apparent from the above description, in accordance with embodiments, an embedded flash memory device and a fabricating method can be formed such that the size of the memory device can be minimized even when applying fabrication processes of a logic CMOS device. Furthermore, the coupling ratio of the respective memory devices can be enhanced.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A flash memory device comprising:
   a coupling oxide layer formed over an active area of a semiconductor substrate;
   a first control gate formed over the coupling oxide layer; and
   a second control gate formed over and enclosing lateral sidewalls of the coupling oxide layer and the first control gate.

2. The flash memory device of claim 1, wherein the first control gate has a stepped portion at lateral sides thereof.

3. The flash memory device of claim 1, further comprising a thermal oxide layer formed over the coupling oxide layer and the first control gate.

4. The flash memory device of claim 1, wherein the coupling oxide layer comprises a tunneling oxide layer.

5. The flash memory device of claim 1, wherein a portion of the coupling oxide layer contacts a lower surface of the second control gate such that the portion serves as a tunneling oxide layer.

6. A method for fabricating a flash memory device comprising:
   forming a coupling oxide layer over an active area of a semiconductor substrate; and then
   forming a first control gate over the coupling oxide layer; and then
   forming a second control gate over and enclosing sidewalls of the coupling oxide layer and the first control gate.

7. The fabricating method of claim 6, wherein forming the first control gate comprises:
   sequentially forming a first polysilicon layer and a first nitride layer over the semiconductor substrate including the coupling oxide layer; and then
   patterning the first nitride layer to form forming a first nitride layer pattern having a width smaller than the width of the coupling oxide layer; and then
   selectively removing the first polysilicon layer by a predetermined thickness using the first nitride layer pattern as a mask to thereby form the first control gate having a stepped portion at lateral sides thereof.

8. The fabricating method of claim 7, further comprising:
   forming a nitride spacer at lateral sidewalls of the first nitride layer pattern and lateral sidewalls of the first polysilicon layer.

9. The fabricating method of claim 8, wherein forming the nitride spacer comprises:
   forming a second nitride layer on the whole surface of the semiconductor substrate; and then
   performing an etching process on the second nitride layer.

10. The fabricating method of claim 9, further comprising:
    performing a second etching process using the first nitride layer pattern and the nitride spacer as masks; and then
    removing the first nitride layer pattern and the nitride spacer.

11. The fabricating method of claim 10, further comprising:
    performing a thermal oxidation process with respect to the whole surface of the semiconductor substrate including the coupling oxide layer pattern and the first control gate.

12. The fabricating method of claim 6, wherein forming the second control gate comprises:
    forming a second polysilicon layer on the whole surface of the semiconductor substrate including the first control gate; and then
    selectively removing the second polysilicon layer to thereby form the second control gate in the form of a sidewall enclosing lateral sidewalls of the coupling oxide layer pattern and the first control gate.

13. The fabricating method of claim 12, further comprising:

forming a sidewall spacer at both sidewalls of the second control gate.

14. A method comprising:

forming an oxide layer pattern in an active area of a semiconductor substrate; and then sequentially forming a first polysilicon layer and a first nitride layer over the semiconductor including oxide layer pattern; and then forming a first nitride layer pattern over the oxide layer pattern and a second nitride layer pattern spaced part from the first nitride layer pattern by patterning the first nitride layer; and then forming stepped portions on portions of the first polysilicon layer formed over the oxide layer pattern by selectively removing the first polysilicon layer using the first and second nitride layer patterns as masks; and then forming a first control gate interposed between the first nitride layer pattern and the oxide layer pattern after forming the nitride spacer; and then forming a gate oxide layer over the control gate and on sidewalls of the control gate; and then forming a second control gate at sidewall of the first control gate; and then forming a sidewall spacer on sidewalls of the second control gate.

15. The method of claim 14, wherein the first nitride layer pattern has a width smaller than the width of the oxide layer pattern.

16. The method of claim 14, further comprising, before forming the control gate and after forming the forming stepped portions:

forming nitride spacers on the stepped portions of the first polysilicon layer and at sidewalls of the first nitride layer patterns, respectively.

17. The method of claim 16, wherein forming the nitride spacer comprises:

forming a second nitride layer over the whole surface of the semiconductor substrate including the first and second nitride layer patterns and the first polysilicon layer; and then performing an anisotropic etching process on the second nitride layer.

18. The method of claim 17, wherein forming the first control gate comprises:

performing an etching process on the first polysilicon layer using the first and second nitride layer patterns and the nitride layer spacers as masks; and then removing the first and second nitride layer patterns and the nitride spacers.

19. The method of claim 14, wherein the control gate comprises a first control gate portion having a first thickness and a first width and a second control gate portion having a second thickness greater than the first thickness and a second width less than the first width.

20. The method of claim 19, wherein the first width is the same as the width of the oxide layer pattern.

* * * * *